US007545156B2

(12) United States Patent
Kuroiwa et al.

(10) Patent No.: US 7,545,156 B2
(45) Date of Patent: Jun. 9, 2009

(54) TEST CIRCUIT AND TEST METHOD THAT INCLUDES SUPPLYING A CURRENT TO A PLURALITY OF LIGHT-RECEIVING ELEMENTS

(75) Inventors: Yousuke Kuroiwa, Osaka (JP); Hideo Fukuda, Kyoto (JP); Hiroshi Yamaguchi, Osaka (JP); Tetsuo Chato, Osaka (JP); Yuzo Shimizu, Osaka (JP); Masaki Taniguchi, Kyoto (JP)

(73) Assignee: Panasonic Corporation, Osaka (JP)

( * ) Notice: Subject to any disclaimer, the term of this patent is extended or adjusted under 35 U.S.C. 154(b) by 221 days.

(21) Appl. No.: 11/677,077

(22) Filed: Feb. 21, 2007

(65) Prior Publication Data

US 2007/0252602 A1    Nov. 1, 2007

(30) Foreign Application Priority Data

Apr. 26, 2006   (JP)   ............... 2006-121886

(51) Int. Cl.
*G01R 27/08*   (2006.01)
*G01R 31/00*   (2006.01)
*H03K 3/02*    (2006.01)
*G01R 21/00*   (2006.01)

(52) U.S. Cl. ............... 324/713; 324/770; 327/187; 330/2

(58) Field of Classification Search ............ 324/713
See application file for complete search history.

(56) References Cited

U.S. PATENT DOCUMENTS

| 5,321,254 | A | * | 6/1994 | Yokogawa et al. ...... 250/214 R |
| 5,425,011 | A | * | 6/1995 | Kusano et al. ........... 369/44.25 |
| 5,585,731 | A |   | 12/1996 | Tsuchida et al. |
| 6,316,955 | B1 |   | 11/2001 | Shimamura et al. |

(Continued)

FOREIGN PATENT DOCUMENTS

JP    64-23172    1/1989

(Continued)

OTHER PUBLICATIONS

English language Abstract of JP 64-23172.

(Continued)

*Primary Examiner*—Timothy J Dole
*Assistant Examiner*—Jeff Natalini
(74) *Attorney, Agent, or Firm*—Greenblum & Bernstein P.L.C.

(57) ABSTRACT

The test circuit according to the present invention includes: a plurality of light-receiving elements; a plurality of amplifiers, each of which converts, into a voltage, a photoelectric current supplied from one of the light-receiving elements; and an electric current supplying unit which supplies an electric current to each of the light-receiving elements and each of the amplifiers. In this test circuit, the electric current supplying unit selectively supplies an electric current to a first group of light-receiving elements and to a second group of light-receiving elements, the first group of light-receiving elements including light-receiving elements, out of the plurality of light-receiving elements, which are neither vertically nor horizontally adjacent to each other, and the second group of light-receiving elements including light-receiving elements, out of the plurality of light-receiving elements, which are vertically or horizontally adjacent to the light-receiving elements of the first group of light-receiving elements.

6 Claims, 5 Drawing Sheets

U.S. PATENT DOCUMENTS 6,624,405 B1 * 9/2003 Lau et al. .............. 250/214 LA
7,335,872 B2 * 2/2008 Fukuda et al. .......... 250/214 A
2003/0011425 A1 * 1/2003 Buescher ...................... 330/2

FOREIGN PATENT DOCUMENTS

| JP | 8-129046 | 5/1996 |
|---|---|---|
| JP | 9-69617 | 3/1997 |
| JP | 10-284707 | 10/1998 |
| JP | 11-110805 | 4/1999 |
| JP | 3203996 | 6/2001 |
| JP | 2002-299460 | 10/2002 |

OTHER PUBLICATIONS

English language Abstract of JP 11-110805.
English language Abstract of JP 9-69617.
English language Abstract of JP 10-284707.
English language Abstract of JP 2002-299460.
English Language Abstract of Corresponding document JP 8-129046.

* cited by examiner

TEST CIRCUIT AND TEST METHOD THAT INCLUDES SUPPLYING A CURRENT TO A PLURALITY OF LIGHT-RECEIVING ELEMENTS

BACKGROUND OF THE INVENTION (1) Field of the Invention

The present invention relates to a test circuit and a test method, and particularly to a test circuit and a test method for testing amplifiers that convert photoelectric currents supplied from light-receiving elements into voltages.

(2) Description of the Related Art

A Photo Detector IC (PDIC) used for optical pick-up (hereinafter referred to as "optical pick-up PDIC") is used for CD players, DVD players and the like in order to convert an optical signal from a CD or a DVD into an electric signal. The optical pick-up PDIC includes a light-receiving element which converts an optical signal into an electric signal, and an amplifier which converts a photoelectric current, supplied from the light-receiving element, into a voltage. A conventional test of the amplifier, included in the optical pick-up PDIC, (a test of, for example, electric characteristics and frequency characteristics) which is performed on occasions such as product shipment employs a method for measuring an output voltage of the amplifier that converts a photoelectric current into a voltage, by irradiating the optical pick-up PDIC with light. However, a test apparatus for irradiating the optical pick-up PDIC with light is costly. Also, there is a problem that such a test, in which the optical pick-up PDIC is irradiated with light, is time consuming, and thus results in a high PDIC cost.

In consideration of the above problem, the following method for testing an amplifier is known: a method in which an electric current is supplied to the amplifier from a test circuit built into an optical pick-up PDIC, rather than to a photoelectric current generated from a light-receiving element by being irradiated with light (refer to Patent Reference 1—Japanese Patent No. 3203996 for an example).

FIG. 1 is a diagram which shows a structure of a test circuit according to Patent Reference 1.

As shown in FIG. 1, a test circuit 500 according to Patent Reference 1 includes an electric current supplying unit 510, and n-1 amplifiers 522-52n.

The electric current supplying unit 510 is a current mirror circuit which includes a plurality of bipolar transistors. By being applied with a voltage to a terminal 511 from outside the test circuit 500, the electric current supplying unit 510 supplies, to each of the amplifiers 522-52n, an electric current corresponding to the applied voltage. In addition, although not shown in the figure, a light-receiving element is connected to the input side of each of the amplifiers.

With the above described structure, the test circuit 500 according to Patent Reference 1 is capable of applying electric currents to the plurality of amplifiers by being applied with the voltage from outside. As a result, it is possible to measure characteristics of the amplifiers by measuring the voltages at terminals Vout, which are outputs of the amplifiers. Therefore, the test circuit 500 according to Patent Reference 1 enables a test of the plurality of amplifiers at a time, without having to irradiate light-receiving elements with light.

SUMMARY OF THE INVENTION

However, although the test circuit according to Patent Reference 1 is capable of testing the amplifiers, it cannot measure a leak current between light-receiving elements. The conventional way of measuring a leak current is carried out by applying, from a test pad, an electric current or a voltage to each light-receiving element, and this measurement is conducted separately from the test of the amplifiers. As a result, there is a problem that a test pad is required for each light-receiving element in a conventional test circuit used for measuring the leak current, which inevitably results in a larger size of a chip.

In consideration of the above described problem, the present invention has an object to provide a test circuit which is used for testing a plurality of amplifiers and detecting a leak current between light-receiving elements, and which is implemented on a small sized chip.

In order to achieve the above mentioned object, the test circuit of the present invention is a test circuit including: a plurality of light-receiving elements; a plurality of amplifiers, each of which converts, into a voltage, a photoelectric current supplied from one of the plurality of light-receiving elements; and an electric current supplying unit which supplies an electric current to each of the plurality of light-receiving elements and each of the plurality of amplifiers. In this test circuit, the electric current supplying unit selectively supplies an electric current to a first group of light-receiving elements and to a second group of light-receiving elements, the first group of light-receiving elements including light-receiving elements, out of the plurality of light-receiving elements, which are neither vertically nor horizontally adjacent to each other, and the second group of light-receiving elements including light-receiving elements, out of the plurality of light-receiving elements, which are vertically or horizontally adjacent to the light-receiving elements of the first group of light-receiving elements.

According to the above described structure, when a test is conducted, the test circuit according to the present invention supplies an electric current to the first group of light-receiving elements which includes the light-receiving elements, out of the plurality of light-receiving elements, which are neither vertically nor horizontally adjacent to each other, and does not supply an electric current to the second group of light-receiving elements which includes the light-receiving elements, out of the plurality of light-receiving elements, which are vertically or horizontally adjacent to the light-receiving elements of the first group of light-receiving elements to which an electric current is supplied. Consequently, when there is a leak current between the light-receiving elements which are vertically or horizontally adjacent to each other, the electric current supplied by the electric current supplying unit to the first group of light-receiving elements flows to the second group of light-receiving elements. The electric current which flowed, due to the leak current, to the second group of light-receiving elements is amplified by amplifiers, out of the plurality of amplifiers, each of which amplifies a photoelectric current supplied from one of the light-receiving elements of the second group of light-receiving elements, and the resultant is outputted as a voltage. Therefore, by measuring the voltages converted and outputted by these amplifiers, it is possible to measure the leak current between the light-receiving elements which are vertically or horizontally adjacent to each other. In addition, by measuring each of outputted voltages converted by each of the amplifiers, out of the plurality of amplifiers, which amplifies a photoelectric current supplied from one of the light-receiving elements of the first group of light-receiving elements to which the electric current supplying unit supplies an electric current, it is possible to test characteristics of these amplifiers. In other words, the test circuit according to the present invention is capable of simultaneously conducting two tests, namely, a test of a plurality of amplifiers and a test of detecting a leak current between light-receiving elements. Further, by controlling an electric current supplying unit from an external terminal, the test circuit according to the present invention is capable of testing characteristics of a plurality of amplifiers and detecting a leak current between light-receiving elements. As a result, the test circuit according to the present invention is not required to have a test pad for each light-receiving element for detecting a leak current, unlike the conventional test circuit which requires such a test pad for each light-receiving element. The test circuit of the present invention is required to have only an external terminal (test pad) for controlling the electric current supplying unit. Therefore, the test circuit according to the present invention can test a plurality of amplifiers and detect a leak current between light-receiving elements, and can be implemented on a small sized chip.

Further, the electric current supplying unit may include: a first electric current supplying subunit which supplies an electric current to the first group of light-receiving elements; and a second electric current supplying subunit which supplies an electric current to the second group of light-receiving elements, and the first electric current supplying subunit does not have to supply an electric current while the second electric current supplying subunit is supplying an electric current, and the second electric current supplying subunit does not have to supply an electric current while the first electric current supplying subunit is supplying an electric current.

According to the above described structure, in a state where the first electric current supplying subunit supplies an electric current, and the second electric current supplying subunit does not supply an electric current, it is possible to measure a leak current between light-receiving elements by measuring an outputted voltage at each of the amplifiers which converts a photoelectric current supplied from one of the light-receiving elements included in the second group of light-receiving elements. In addition, at the same time, by measuring an outputted voltage at each of the amplifiers, out of the plurality of amplifiers, which converts a photoelectric current supplied from one of the light-receiving elements to which the first electric current supplying subunit supplies an electric current, it is possible to test the characteristics of these amplifiers. Moreover, in a state where the second electric current supplying subunit supplies an electric current, and the first electric current supplying subunit does not supply an electric current, it is possible to measure a leak current between light-receiving elements by measuring an outputted voltage at each of the amplifiers, out of the plurality of amplifiers, which converts a photoelectric current supplied from one of the light-receiving elements included in the first group of light-receiving elements. In addition, at the same time, by measuring an outputted voltage at each of the amplifiers which converts a photoelectric current supplied from one of the light-receiving elements to which the second electric current supplying subunit supplies an electric current, it is possible to test the characteristics of these amplifiers. Accordingly, the test circuit according to the present invention is capable of simultaneously conducting two tests, namely, a test of a plurality of amplifiers and a test of detecting a leak current between light-receiving elements. Further, by controlling the first electric current supplying subunit and the second electric current supplying subunit from an external terminal, the test circuit according to the present invention is capable of testing characteristics of a plurality of amplifiers and detecting a leak current between light-receiving elements. As a result, the test circuit according to the present invention is not required to have a test pad for each light-receiving element for detecting a leak current, unlike the conventional test circuit which requires such a test pad for each light-receiving element. The test circuit of the present invention is required to have only an external terminal for controlling the first electric current supplying subunit and the second electric current supplying subunit. Therefore, the test circuit according to the present invention can test a plurality of amplifiers and detect a leak current between light-receiving elements, and can be implemented on a small sized chip.

Furthermore, the electric current supplying unit may supply an electric current having a first electric current value to a first light-receiving element included in the first group of light-receiving elements, and may supply an electric current having a second electric current value to a second light-receiving element included in the first group of light-receiving elements.

The above described structure allows electric currents having different electric current values to be simultaneously supplied to each of the plurality of light-receiving elements and to each of the plurality of amplifiers. As a result, even in the case where the plurality of light-receiving elements are in different sizes and the plurality of amplifiers have different gains, it is possible to supply electric currents in accordance with the gains of the amplifiers. Therefore, even in the case where the amplifiers have different gains, the test circuit according to the present invention is capable of simultaneously and efficiently measuring characteristics of a plurality of amplifiers.

In addition, the electric current supplying unit may include: an electric current supplying subunit which outputs an electric current; and a plurality of switches, each of which is provided between (i) an output of the electric current supplying subunit, and (ii) a pair of one of the plurality of light-receiving elements and one of the plurality of amplifiers.

The above described structure allows an electric current to be selectively supplied to the plurality of light-receiving elements by turning on/off of the switches. For example, it is assumed that the switches which are connected to the light-receiving elements that are neither vertically nor horizontally adjacent to each other are turned on, and the switches which are connected to the light-receiving elements that are vertically or horizontally adjacent to the above mentioned light-receiving elements are turned off. In such a case, it is possible to measure a leak current between light-receiving elements by measuring an outputted voltage at each of the amplifiers, out of the plurality of amplifiers, which converts a photoelectric current supplied from one of the light-receiving elements to which the switches that are turned off are connected. In addition, at the same time, by measuring an outputted voltage at each of the amplifiers, out of the plurality of amplifiers, which converts a photoelectric current supplied from one of the light-receiving elements to which the switches that are turned on are connected, it is possible to test the characteristics of these amplifiers. Therefore, the test circuit according to the present invention is capable of simultaneously conducting two tests, namely, a test of a plurality of amplifiers and a test of detecting a leak current between light-receiving elements. Further, by controlling the switches from an external terminal, the test circuit according to the present invention is capable of testing characteristics of a plurality of amplifiers and detecting a leak current between light-receiving elements. As a result, the test circuit according to the present invention is not required to have a test pad for each light-receiving element for detecting a leak current, unlike the conventional test circuit which requires such a test pad for each light-receiving element. The test circuit of the present invention is required to have only an external terminal for controlling the switches. Therefore, the test circuit according to the present invention can test a plurality of amplifiers and detect a leak current between light-receiving elements, and can be implemented on a small sized chip.

Further, the test circuit may further include a voltage supplying unit which supplies: a first reference voltage to a first group of amplifiers, out of the plurality of amplifiers, which includes amplifiers each of which converts, into a voltage, the photoelectric current supplied from one of the light-receiving elements included in the first group of light-receiving elements; and a second reference voltage to a second group of amplifiers, out of the plurality of amplifiers, which includes amplifiers, each of which converts, into a voltage, the photoelectric current supplied from one of the light-receiving elements included in the second group of light-receiving elements.

The above described structure allows different reference voltages to be supplied to the amplifiers of the first group of amplifiers and to the amplifiers of the second group of amplifiers. Therefore, different voltages can be supplied to the light-receiving elements of the first group of light-receiving elements and to the light-receiving elements of the second group of light-receiving elements. As a result, a difference in voltages is generated between the light-receiving elements of the first group of light-receiving elements and the light-receiving elements of the second group of light-receiving elements, and when there is a leak current between the light-receiving elements which are vertically or horizontally adjacent to each other, there will be a change in output voltages of the amplifiers which correspond to the light-receiving elements between which the leak current is generated. In other words, in the state where different reference voltages are supplied to the amplifiers of the first group of amplifiers and the amplifiers of the second group of amplifiers, it is possible to measure a leak current between light-receiving elements by measuring an outputted voltage at each of the plurality of amplifiers. In addition, by generating a difference in voltages between the light-receiving elements which are vertically or horizontally adjacent to each other, it is possible to detect a leak current which differs from a leak current which can be detected when an electric current is supplied.

Furthermore, the test method according to the present invention is a test method for testing a plurality of amplifiers, each of which converts, into a voltage, a photoelectric current supplied from one of a plurality of light-receiving elements, the test method including: selectively supplying an electric current to a first group of light-receiving elements and to a second group of light-receiving elements, the first group of light-receiving elements including a plurality of light-receiving elements, out of the plurality of light-receiving elements, which are neither vertically nor horizontally adjacent to each other, and the second group of light-receiving elements including a plurality of light-receiving elements, out of the plurality of light-receiving elements, which are vertically or horizontally adjacent to the light-receiving elements included in the first group of light-receiving elements; measuring the voltage converted by each of the amplifiers; judging, based on the voltage converted by each of the amplifiers which converts, into a voltage, the photoelectric current supplied from one of the light-receiving elements included in the first group of light-receiving elements, whether or not each of the amplifiers is properly operating; and judging a leak current between the plurality of light-receiving elements, based on the voltage converted by each of the amplifiers which converts, into a voltage, the photoelectric current supplied from one of the light-receiving elements included in the second group of light-receiving elements.

According to the above described method, when a test is conducted, the test method according to the present invention allows: an electric current to be supplied to the first group of light-receiving elements which includes the light-receiving elements, out of the plurality of light-receiving elements, which are neither vertically nor horizontally adjacent to each other; and an electric current not to be supplied to the second group of light-receiving elements which includes the light-receiving elements, out of the plurality of light-receiving elements, which are vertically or horizontally adjacent to the light-receiving elements of the first group of light-receiving elements to which an electric current is supplied. Consequently, when there is a leak current between the light-receiving elements which are vertically or horizontally adjacent to each other, the electric current supplied to the first group of light-receiving elements flows to the light-receiving elements of the second group of light-receiving elements. The electric current which flowed, due to the leak current, to the light-receiving elements of the second group of light-receiving elements is amplified by amplifiers, out of the plurality of amplifiers, each of which amplifies a photoelectric current supplied from one of the light-receiving elements of the second group of light-receiving elements, and the resultant is outputted as a voltage. Therefore, by measuring the voltages outputted by these amplifiers, it is possible to measure the leak current between the light-receiving elements which are vertically or horizontally adjacent to each other. In addition, by measuring an outputted voltage at each of the amplifiers, out of the plurality of amplifiers, which amplifies a photoelectric current supplied from one of the light-receiving elements to which an electric current is supplied, it is possible to test characteristics of these amplifiers. In other words, the test method according to the present invention enables a test circuit to simultaneously conduct two tests, namely, a test of a plurality of amplifiers and a test of detecting a leak current between light-receiving elements. Further, by controlling, from an external terminal, an electric current supplied to a plurality of light-receiving elements, the test method according to the present invention enables a test circuit to test characteristics of a plurality of amplifiers and detect a leak current between light-receiving elements. As a result, the test method according to the present invention does not require a test circuit to have a test pad for each light-receiving element for detecting a leak current, unlike the conventional test method which requires a test circuit to have such a test pad for each light-receiving element. The test method of the present invention requires a test circuit to have only an external terminal (test pad) for controlling an electric current supplied to light-receiving elements. Therefore, through the test method of the present invention, a test circuit is capable of testing a plurality of amplifiers and detecting a leak current between light-receiving elements, and can be implemented on a small sized chip.

The present invention is capable of providing a test circuit which is used for testing a plurality of amplifiers and detecting a leak current between light-receiving elements, and which is implemented on a small sized chip.

FURTHER INFORMATION ABOUT TECHNICAL BACKGROUND TO THIS APPLICATION

The disclosure of Japanese Patent Application No. 2006-121886 filed on Apr. 26, 2006 including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF PREFERRED EMBODIMENTS

With reference to the drawings, the following describes preferred embodiments of a test circuit according to the present invention.

First Embodiment

A test circuit according to the present embodiment selectively supplies an electric current to a plurality of light-receiving elements which are neither vertically nor horizontally adjacent to each other, using two electric current supplying units. This structure enables simultaneous conducting of two tests, namely, a test of amplifiers and a test of detecting a leak current between light-receiving elements.

First, a structure of the test circuit according to a first embodiment is described.

Figure 1:
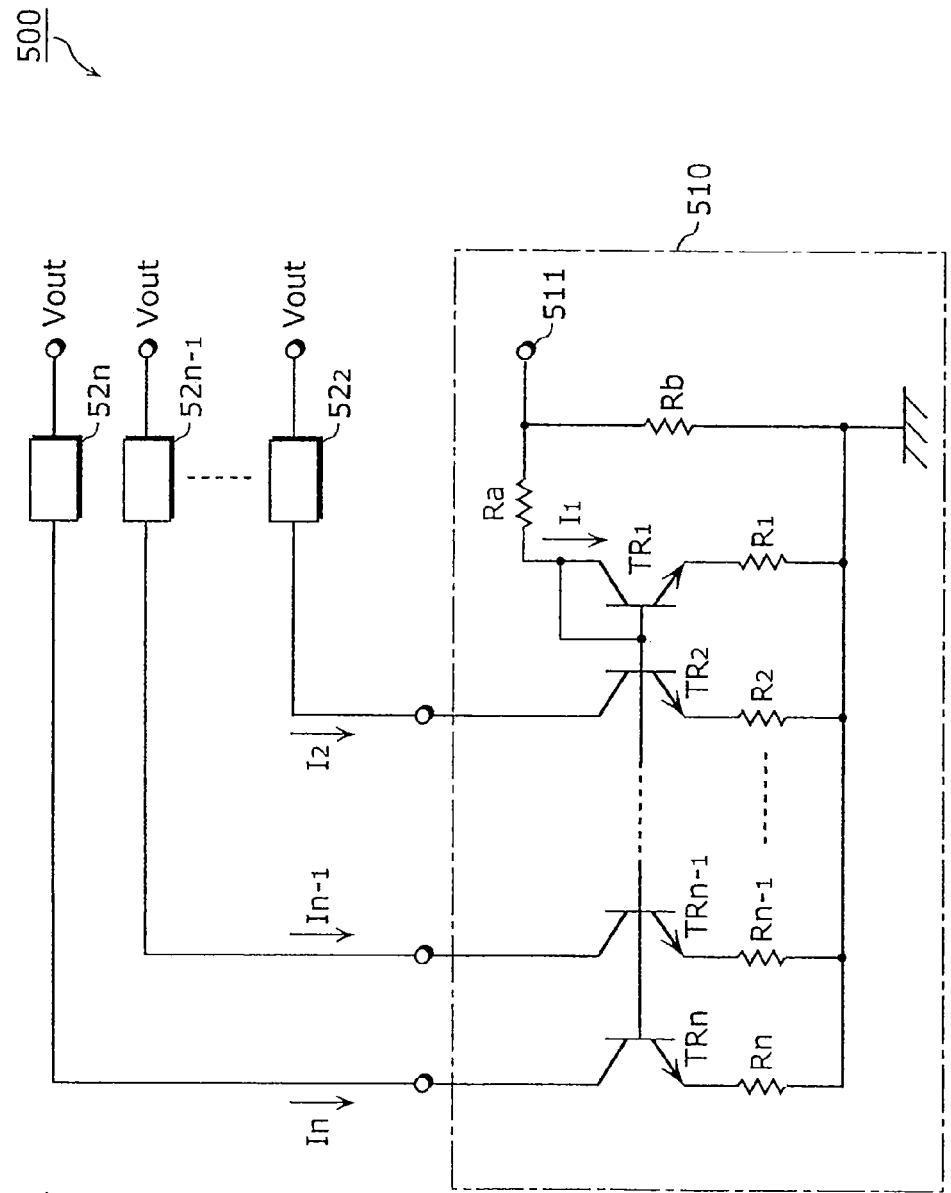
FIG. 1 is a diagram which shows a structure of the conventional test circuit.
Figure 2:
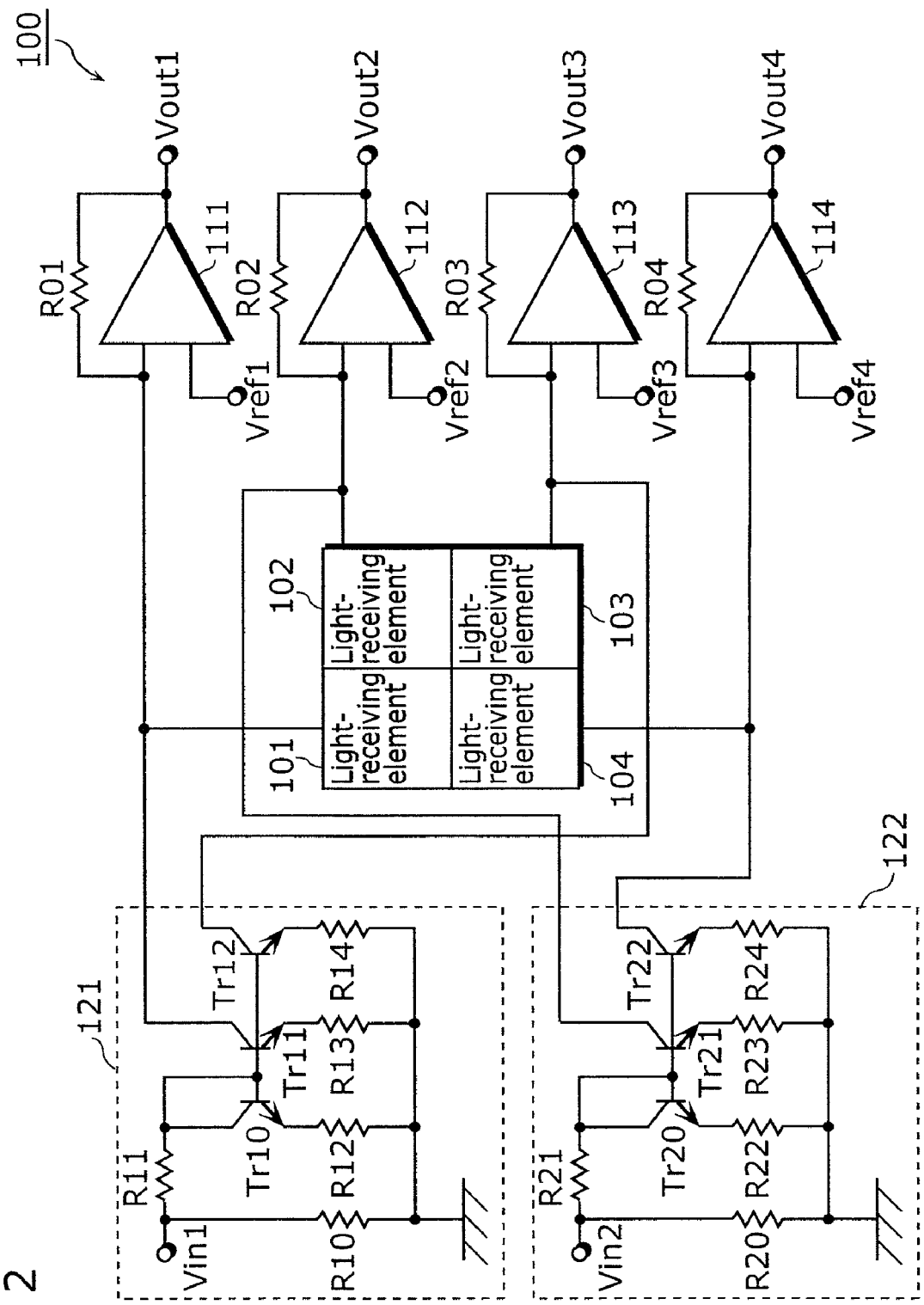
FIG. 2 is a diagram which shows a structure of a test circuit according to a first embodiment of the present invention.

FIG. 2 is a diagram which shows the structure of the test circuit according to the first embodiment.

A test circuit 100 shown in FIG. 2 includes light-receiving elements 101-104, amplifiers 111-114, a first electric current supplying unit 121, and a second electric current supplying unit 122. The test circuit 100 tests characteristics of the amplifiers 111-114. Further, the test circuit 100 detects a leak current between the light-receiving elements 101-104.

An example of each of the light-receiving elements 101-104 is a photodiode which converts irradiated light into an electric current. The light-receiving elements 101-104 are placed in a lattice-like arrangement.

An example of each of the amplifiers 111-114 is a differential amplifier circuit. Reference voltages Vref1-Vref4 are inputted to the amplifiers 111-114, respectively. A negative feedback is formed on each of the amplifiers 111-114 via each of the resistances R01-R04. The amplifiers 111-114 each convert, into a voltage, a photoelectric current supplied from corresponding one of the light-receiving elements 101-104. More specifically, the amplifier 111 converts and amplifies a photoelectric current supplied from the light-receiving element 101, and then outputs the resultant as a voltage Vout1. The amplifier 112 converts and amplifies a photoelectric current supplied from the light-receiving element 102, and then outputs the resultant as a voltage Vout2. The amplifier 113 converts and amplifies a photoelectric current supplied from the light-receiving element 103, and then outputs the resultant as a voltage Vout3. The amplifier 114 converts and amplifies a photoelectric current supplied from the light-receiving element 104, and then outputs the resultant as a voltage Vout4.

The first electric current supplying unit 121 supplies an electric current to light-receiving elements which are neither vertically nor horizontally adjacent to each other. More specifically, the first electric current supplying unit 121 supplies an electric current to: the light-receiving element 101 and the amplifier 111 which converts, into a voltage, the photoelectric current supplied from the light-receiving element 101; and the light-receiving element 103 which is neither vertically nor horizontally adjacent to the light-receiving element 101, and the amplifier 113 which converts, into a voltage, the photoelectric current supplied from the light-receiving element 103. The first electric current supplying unit 121 is a current mirror circuit which includes resistances R10-R14 and npn-type bipolar transistors Tr10-Tr12. The first electric current supplying unit 121 supplies, to the above mentioned light-receiving elements and amplifiers, an electric current corresponding to a voltage applied to a terminal Vin1 from outside the test circuit 100 (for example, a semiconductor tester).

The resistance R10 is connected between the terminal Vin1 and the ground. The collector and the base of the transistor Tr10 are connected to the terminal Vin1 via the resistance R11, and the emitter of the transistor Tr10 is connected to the ground via the resistance R12. The base of the transistor Tr11 is connected to the collector and the base of the transistor Tr10, the collector of the transistor Tr11 is connected to the light-receiving element 101 and the input of the amplifier 111, and the emitter of the transistor Tr11 is connected to the ground via the resistance R13. The base of the transistor Tr12 is connected to the collector and the base of the transistor Tr10, the collector of the transistor Tr12 is connected to the light-receiving element 103 and the input of the amplifier 113, and the emitter of the transistor Tr12 is connected to the ground via the resistance R14. For example, resistance values of the resistances R12, R13 and R14 are equal, and the sizes of the transistors Tr10, Tr11 and Tr12 are equal. With this structure, an electric current, the value of which corresponds to the voltage applied to the terminal Vin1, flows to the transistor Tr10 and the resistance R12. Also, an electric current having the same electric current value as the above mentioned value flows to the transistor Tr11 and Tr12, and to the amplifiers 111 and 113.

The second electric current supplying unit 112 supplies an electric current to light-receiving elements which are vertically or horizontally adjacent to the light-receiving elements to which the first electric current supplying unit 121 supplies an electric current. More specifically, the second electric current supplying unit 122 supplies an electric current to: the light-receiving element 102 and the amplifier 112 which converts, into a voltage, the photoelectric current supplied from the light-receiving element 102; and the light-receiving element 104 which is neither vertically nor horizontally adjacent to the light-receiving element 102 and the amplifier 114 which converts, into a voltage, the photoelectric current supplied from the light-receiving element 104. The second electric current supplying unit 122 is a current mirror circuit which includes resistances R20-R24 and npn-type bipolar transistors Tr20-Tr22. The second electric current supplying unit 122 supplies, to the above mentioned light-receiving elements and amplifiers, an electric current corresponding to a voltage applied to a terminal Vin2 from outside the test circuit 100. Note that a description of a detailed structure of the second electric current supplying unit 122 is omitted since it is the same as the structure of the first electric current supplying unit 121.

Next, an operation of the test circuit 100 according to the present embodiment is described.

First, a signal with a predetermined voltage is applied to the terminal Vin1 from outside the test circuit 100, and the terminal Vin2 is set to the ground level. Here, the signal with the predetermined voltage is a signal in accordance with details of the test. Examples of the signal are a sinusoidal waveform signal with a predetermined frequency, and a direct current (DC) voltage. When the test is conducted, the light-receiving elements 101-104 are not irradiated with light, and thus do not generate photoelectric currents.

The first electric current supplying unit 121 supplies, to each of the amplifiers 111 and 113, an electric current corresponding to the voltage applied to the terminal Vin1. Each of the amplifiers 111 and 113 amplifies the supplied electric current, converts it into a voltage, and outputs the resulting voltage to each of the terminals Vout1 and Vout3. As a result, by measuring the outputted voltage at each of the terminals Vout1 and Vout3 which corresponds to the voltage applied to the terminal Vin1, it is possible to measure characteristics (current-voltage characteristics and frequency characteristics) of the amplifiers 111 and 113. In other words, it is possible to determine whether or not the amplifiers 111 and 113 are properly operating, based on the voltages converted by the respective amplifiers 111 and 113.

Meanwhile, the second electric current supplying unit 122 does not supply an electric current to the light-receiving elements 102 and 104, and to the amplifiers 112 and 114, because the terminal Vin2 is set to the ground level. If there is a leak current between light-receiving elements, the electric current supplied from the first electric current supplying unit 121 flows from the light-receiving element 101 or 103 to the light-receiving element 102 or 104. As a result, the amplifier 112 or 114 amplifies the 10 electric current which has flowed to the light-receiving element 102 or 104, and converts the resulting electric current into a voltage. Consequently, by measuring the voltages at the terminal Vout2 and a terminal Vout4, it is possible to measure the leak current generated between light-receiving elements.

Next, the predetermined voltage is applied to the terminal Vin2 from outside the test circuit 100, and the terminal Vin1 is set to the ground level.

The second electric current supplying unit 122 supplies, to each of the amplifiers 112 and 114, an electric current corresponding to the voltage applied to the terminal Vin2. Each of the amplifiers 112 and 114 amplifies the supplied electric current, converts it into a voltage, and outputs the resulting voltage to each of the terminals Vout2 and Vout4. As a result, by measuring the outputted voltage at each of the terminals Vout2 and Vout4 which corresponds to the voltage applied to the terminal Vin2, it is possible to measure characteristics of each of the amplifiers 112 and 114. In other words, it is possible to determine whether or not the amplifiers 112 and 114 are properly operating, based on the voltages converted by the respective amplifiers 112 and 114.

Meanwhile, the first electric current supplying unit 121 does not supply an electric current to the light-receiving elements 101 and 103, and to the amplifiers 111 and 113, because the terminal Vin1 is set to the ground level. If there is a leak current between light-receiving elements, the electric current supplied from the second electric current supplying unit 122 flows from the light-receiving element 102 or 104 to the light-receiving element 101 or 103. As a result, the amplifier 111 or 113 amplifies the electric current which has flowed to the light-receiving 101 or 103, and converts the resulting electric current into a voltage. Consequently, by measuring the voltages at the terminal Vout1 and the terminal Vout3, it is possible to measure the leak current generated between light-receiving elements. Note that the flow direction of the measured leak current between light-receiving elements is opposite to the flow direction of the leak current which can be measured in a state where the terminal Vin1 is applied with a voltage and the terminal Vin2 is set to the ground level.

Through the above described operations, it is possible to measure the characteristics of the amplifiers 111-114, and measure a leak current between the light-receiving elements 101-104. The conventional test circuit has separately conducted the measurement of the characteristics of the amplifiers 111-114, and the measurement of a leak current between the light-receiving elements 101-104. In contrast, the test circuit according to the present embodiment is capable of simultaneously measuring both the characteristics of the amplifiers 111-114 and a leak current between the light-receiving elements 101-104, using the same circuit. Consequently, the test circuit according to the present embodiment makes it possible to test the amplifiers 111-114 and detect a leak current between the light-receiving elements 101-104 efficiently in a short time.

In addition, by controlling the voltage applied to the terminals Vin1 and Vin2 from outside, the test circuit 100 according to the present embodiment is capable of measuring the characteristics of the amplifiers 111-114, and a leak current between the light-receiving elements 101-104. In other words, the test circuit 100 according to the present embodiment is required to have only two test pads for applying a voltage to each of the terminals Vin1 and Vin2. On the other hand, the conventional test circuit used for detecting a leak current requires to have a test pad for each of the light-receiving elements 101-104. That is to say, when the test circuit includes four light-receiving elements, four test pads are required. Consequently, the test circuit 100 according to the present embodiment, compared to the conventional test circuit, needs a smaller number of test pads, which leads to a smaller sized chip.

Note that although the test circuit described above has four light-receiving elements and four amplifiers, the present invention is not limited to this. The same advantages as those produced by the above described test circuit can be obtained, even if the test circuit has three or less, or five or more light-receiving elements and amplifiers, provided that the number of light-receiving elements and the number of amplifiers are plural. Further, in the case where there is a greater number of light-receiving elements and amplifiers, an increased number of test pads can be reduced, compared to the number of test pads needed in the conventional test circuit used for detecting a leak current.

Furthermore, in the above described first electric current supplying unit 121, which is a current mirror circuit, the resistance values of the resistances R12, R13 and R14 are equal, and the sizes of the transistors Tr10, Tr11 and Tr12 are equal. However, the present invention is not limited to this. The resistance values and the transistor sizes may be voluntary. For example, the sizes of the transistors Tr10, Tr11 and Tr12 may be set so that the values of the electric currents flowing to the respective transistors Tr11 and Tr12 are integral multiples of the value of the electric current flowing to the transistor Tr10.

Further, although the first electric current supplying unit 121 and the second electric current supplying unit 122 described above include npn-type bipolar transistors, they may include pnp-type bipolar transistors. Furthermore, the first electric current supplying unit 121 and the second electric current supplying unit 122 may include a field effect transistor.

In addition, the first electric current supplying unit 121 and the second electric current supplying unit 122 descried above operate by being applied with a voltage to the terminal Vin1 or Vin2 10 from outside the test circuit 100. However, the first electric current supplying unit 121 and the second electric current supplying unit 122 may operate by being applied with an electric current from outside the test circuit 100. For example, an electric current may be applied to the collector and the base of the transistor Tr10 (or Tr20) in the first electric current supplying unit 121 (or the second electric current supplying unit 122) which does not include resistances R10 and R11 (or resistances R20 and R21).

Further, in the above description, the voltage applied to the terminals Vin1 and Vin2 is supplied from outside the test circuit 100, but the present invention is not limited to this. For example, a voltage may be applied to the terminals Vin1 and Vin2 from an internal circuit which is formed on a semiconductor substrate on which the test circuit 100 is formed, based on a signal from outside the semiconductor substrate.

Furthermore, in the above description, there are two electric current supplying units. However, there may be three or more electric current supplying units, as long as each of the electric current supplying units can selectively supply an electric current to the light-receiving elements which are neither vertically nor horizontally adjacent to each other.

Second Embodiment

The first embodiment described the test circuit 100, which supplies electric currents, the values of which are equal, to the respective light-receiving elements. A second embodiment describes a test circuit 200, which supplies electric currents, the values of which are different, to the respective light-receiving elements.

Due to design reasons, the following cases are possible for an optical pick-up PDIC which is used for converting an optical signal from a CD or a DVD into an electric signal: the light-receiving elements take different sizes; and the light-receiving elements each receive a different amount of light although they are in the same size. In these cases, when the light-receiving elements receive light, they generate respective photoelectric currents, the values of which are also different. Also, a gain is set for each amplifier based on a value of a photoelectric current supplied from the corresponding light-receiving element. When a test of amplifiers having different gains is conducted, the ranges of values, required for the test, of electric currents supplied to the amplifiers vary. Therefore, if the gains of the respective amplifiers are not equal, a test cannot be efficiently conducted in the case where an electric current supplying unit supplies, to all the selected amplifiers, electric currents, the values of which are equal.

Figure 3:
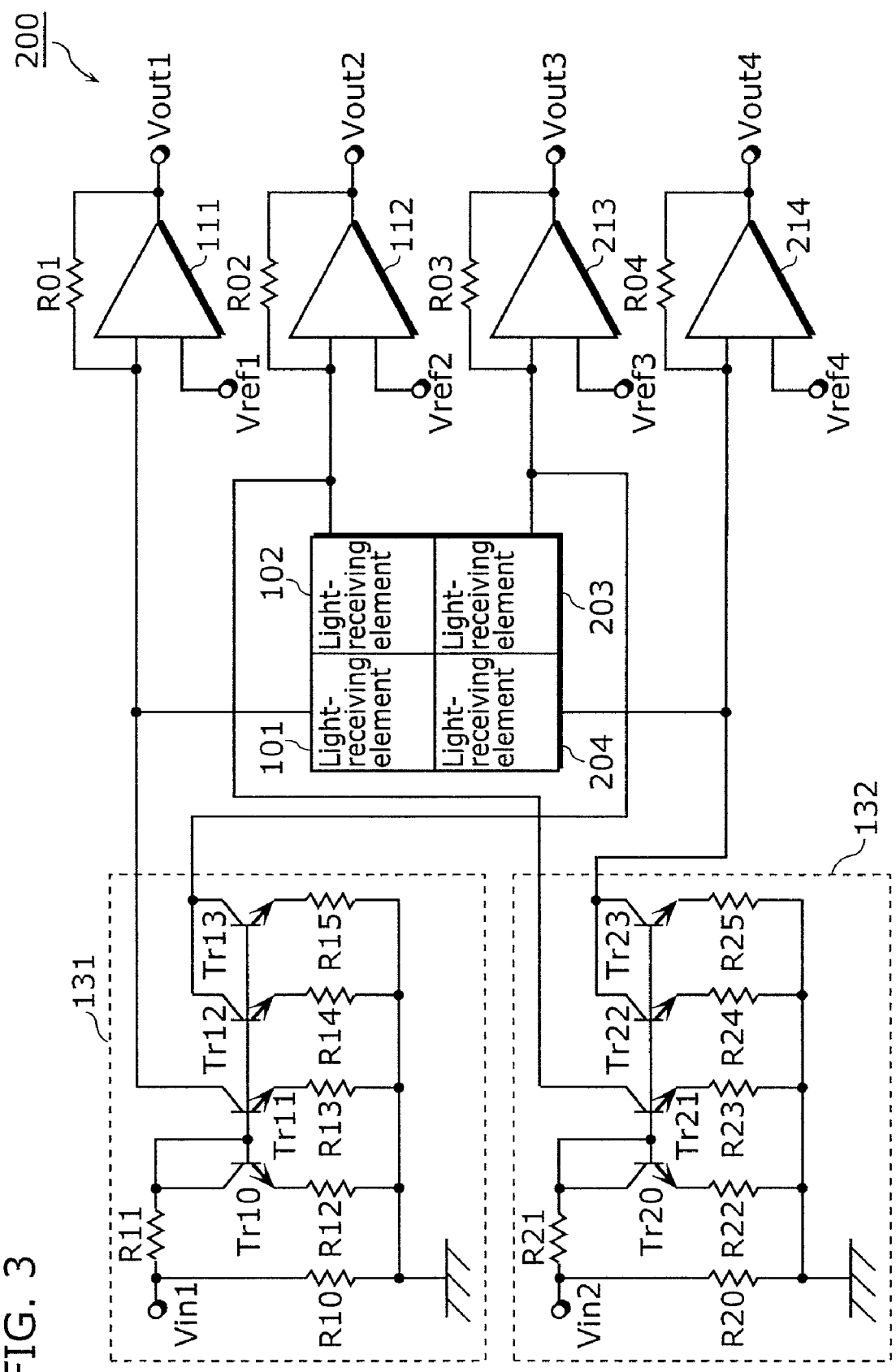
FIG. 3 is a diagram which shows a structure of a test circuit according to a second embodiment of the present invention.

FIG. 3 is a diagram which shows a structure of a test circuit according to the second embodiment. Note that the same components as the ones in FIG. 2 are given the same reference numbers, and their detailed descriptions are omitted.

A test circuit 200 shown in FIG. 3 includes light-receiving elements 101, 102, 203 and 204, amplifiers 111, 112, 213 and 214, a first electric current supplying unit 131, and a second electric current supplying unit 132. The test circuit 200 tests characteristics of the amplifiers 111, 112, 213 and 214. Further, the test circuit 200 detects a leak current between the light-receiving elements 101, 102, 203, and 204.

The light-receiving elements 203 and 204 are twice the size of the light-receiving elements 101 and 102, and generate photoelectric currents, the values of which are twice the values of the photoelectric currents generated by the light-receiving elements 101 and 102.

The amplifiers 213 and 214 have half the gain of the amplifiers 111 and 112.

The first electric current supplying unit 131 includes a transistor Tr13 and a resistance R15 in addition to the components of the first electric current supplying unit 121 in the first embodiment. The base of the transistor Tr13 is connected to the collector and the base of the transistor Tr10, and the collector of the transistor Tr13 is connected to the light-receiving element 203 and the input of the amplifier 213, and the emitter of the transistor Tr13 is connected to the ground via the resistance R15. Here, it is assumed that the sizes of the transistors Tr10-Tr13 are equal, and resistance values of the resistances R12-R15 are equal. This structure of the first electric current supplying unit 131 allows an electric current which corresponds to a voltage applied to a terminal Vin1 to flow to the transistor Tr10. Also, an electric current, the value of which is equal to the value of the electric current flowing to the transistor Tr10, flows to the transistors Tr11, Tr12 and Tr13. In other words, an electric current, the value of which is twice the value of the electric current supplied to the light-receiving element 101 and the amplifier 111, is supplied to the light-receiving element 203 and the amplifier 213.

The second electric current supplying unit 132 includes a transistor Tr23 and a resistance R25 in addition to the components of the second electric current supplying unit 122 in the first embodiment. The base of the transistor Tr23 is connected to the collector and the base of the transistor Tr20, the collector of the transistor Tr23 is connected to the light-receiving element 204 and the input of the amplifier 214, and the emitter of the transistor Tr23 is connected to the ground via the resistance R25. Here, it is assumed that the sizes of the transistors Tr20-Tr23 are equal, and resistance values of the resistances R22-R25 are equal. This structure of the second electric current supplying unit 132 allows an electric current which corresponds to a voltage applied to a terminal Vin2 to flow to the transistor Tr20. Also, an electric current, the value of which is equal to the value of the electric current flowing to the transistor Tr20, flows to the transistors Tr21, Tr22 and Tr23. In other words, an electric current, the value of which is twice the value of the electric current supplied to the light-receiving element 102 and the amplifier 112, is supplied to the light-receiving element 204 and the amplifier 214.

The above described structure of the test circuit 200 according to the present embodiment allows an electric current, the value of which is twice the value of the electric current supplied to the amplifier 111, to be supplied to the amplifier 213 in a state where the predetermined voltage is applied to the terminal Vin1 from outside, and where the voltage of the terminal Vin2 is set to the ground level. In other words, when the test is conducted, the first electric current supplying unit 131 supplies, to the amplifiers 111 and 213, electric currents, at the same ratio as the ratio between the values of the photoelectric currents generated by light-receiving elements 101 and 203 when being irradiated with light. Therefore, by measuring a voltage at each of the terminals Vout1 and Vout3 which corresponds to the voltage applied to the terminal Vin1, it is possible to efficiently measure, at a time, both the characteristics of the amplifier 111, and the characteristics of the amplifier 213 which has half the gain of the amplifier 111. Moreover, by measuring a voltage at each of the terminals Vout2 and Vout4, it is possible, as it is in the first embodiment, to measure a leak current between light-receiving elements.

In a state where the predetermined voltage is applied to the terminal Vin2 from outside the test circuit 200, and where the voltage of the terminal Vin1 is set to the ground level, an electric current, the value of which is twice the value of the electric current supplied to the amplifier 112, is supplied to the amplifier 214. Therefore, by measuring a voltage at each of the terminals Vout2 and Vout4 which corresponds to the voltage applied to the terminal Vin2, it is possible to efficiently measure, at a time, both the characteristics of the amplifier 112, and the characteristics of the amplifier 214 which has half the gain of the amplifier 112. Moreover, by measuring a voltage at each of the terminals Vout1 and Vout3, it is possible, as it is in the first embodiment, to measure a leak current between light-receiving elements. Further, it is also possible, as it is in the first embodiment, to reduce the size of the chip.

Note that, in the above description, although the value of the photoelectric current generated by each of the light-receiving elements 203 and 204 is twice the value of the photoelectric current generated by each of the light-receiving elements 101 and 102, the present invention is not limited to this. The ratio of the photoelectric currents between the light-receiving elements, and the gain ratio of the amplifiers may be voluntary. The first electric current supplying unit 131 or the second electric current supplying unit 132 may change the ratio of the electric currents which are to be supplied to the light-receiving elements and the amplifiers, depending on the ratio between the photoelectric currents of the light-receiving elements and on the gain ratio of the amplifiers.

Third Embodiment

A test circuit according to a third embodiment of the present invention selectively supplies, to light-receiving elements which are neither vertically nor horizontally adjacent to each other, an electric current supplied from one electric current supplying unit using switches. This structure enables simultaneous conducting of two tests, namely, a test of amplifiers and a test of detecting a leak current between light-receiving elements.

First, a structure of the test circuit according to the third embodiment is described.

Figure 4:
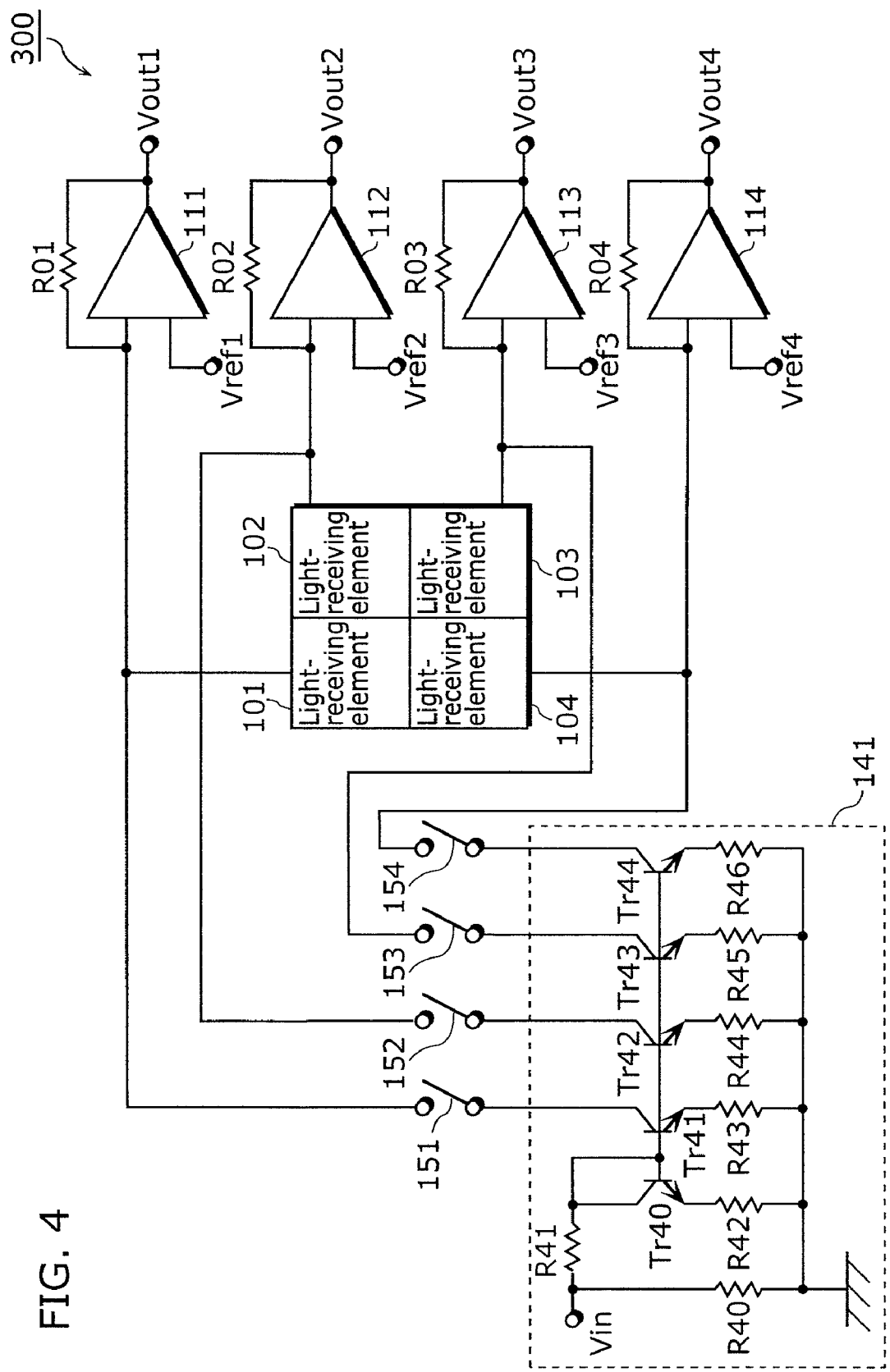
FIG. 4 is a diagram which shows a structure of a test circuit according to a third embodiment of the present invention.

FIG. 4 is a diagram which shows the structure of the test circuit according to the third embodiment of the present invention. Note that the same components as the ones in FIG. 2 are given the same reference numbers, and their detailed descriptions are omitted.

A test circuit 300 shown in FIG. 4 includes light-receiving elements 101-104, amplifiers 111-114, an electric current supplying unit 141, and switches 151-154. The test circuit 300 tests characteristics of the amplifiers 111-114. Further, the test circuit 300 detects a leak current between the light-receiving elements 101-104.

The electric current supplying unit 141 is a current mirror circuit which includes npn-type bipolar transistors Tr40-Tr44 and resistances R40-R46. The electric current supplying unit 141 outputs an electric current corresponding to a voltage applied to a terminal Vin.

The resistance R40 is connected between the terminal Vin and the ground. The collector and the base of the transistor Tr40 are connected to the terminal Vin via the resistance R41, and the emitter of the transistor Tr40 is connected to the ground via the resistance R42. The base of the transistor Tr41 is connected to the collector and the base of the transistor Tr40, the collector of the transistor Tr41 is connected to the switch 151, and the emitter of the transistor Tr41 is connected to the ground via the resistance R43. The base of the transistor Tr42 is connected to the collector and the base of the transistor Tr40, the collector of the transistor Tr42 is connected to the switch 152, and the emitter of the transistor Tr42 is connected to the ground via the resistance R44. The base of the transistor Tr43 is connected to the collector and the base of the transistor Tr40, the collector of the transistor Tr43 is connected to the switch 153, and the emitter of the transistor Tr43 is connected to the ground via the resistance R45. The base of the transistor Tr44 is connected to the collector and the base of the transistor Tr40, the collector of the transistor Tr44 is connected to the switch 154, and the emitter of the transistor Tr44 is connected to the ground via the resistance R46. For example, it is assumed that resistance values of the resistances R42-R46 are equal, and the sizes of the transistors Tr40-Tr44 are equal. With this structure, an electric current, the value of which corresponds to the voltage applied to the terminal Vin, flows to the transistor Tr40. Also, an electric current having the same electric current value as the above mentioned value flows to each of the transistors Tr41-Tr44.

Each of the switches 151-154 is provided between (i) the electric current supplying unit 141, and (ii) a pair of one the light-receiving elements 101-104 and one of inputs of the amplifiers 111-114. An example of each of the switches 151-154 is an analog switch using transistors. Turning on/off of the switches 151-154 is controlled, for example, by a signal applied from outside the test circuit 300 when the test is conducted. The switch 151 is provided between (i) the transistor Tr41, and (ii) the pair of the light-receiving element 101 and the input of the amplifier 111. The switch 152 is provided between (i) the transistor Tr42, and (ii) the pair of the light-receiving element 102 and the input of the amplifier 112. The switch 153 is provided between (i) the transistor Tr43, and (ii) the pair of the light-receiving element 103 and the input of the amplifier 113. The switch 154 is provided between (i) the transistor Tr44, and (ii) the pair of the light-receiving element 104 and the input of the amplifier 114.

Next, operations of the test circuit 300 according to the third embodiment are described.

First, the switches 151 and 153 are turned on, and the switches 152 and 154 are turned off. Also, the predetermined voltage is applied to the terminal Vin.

Because the switches 151 and 153 are turned on, the electric current supplying unit 141 supplies, to each of the amplifiers 111 and 113, an electric current corresponding to the voltage applied to the terminal Vin. Each of the amplifiers 111 and 113 amplifies and converts, into a voltage, the electric current supplied from the electric current supplying unit 141, and then outputs the resultant to each of terminals Vout1 and Vout3. Therefore, by measuring the voltage at each of the terminals Vout1 and Vout3 which corresponds to the voltage applied to the terminal Vin, it is possible to measure the characteristics of the amplifiers 111 and 113.

Meanwhile, because the switches 152 and 154 are turned off, no electric current is supplied to the light-receiving elements 102 and 104, and to the amplifiers 112 and 114. If there is a leak current between light-receiving elements, the electric current supplied from the electric current supplying unit 141 flows from the light-receiving element 101 or 103 to the light-receiving element 102 or 104. As a result, the amplifier 112 or 114 amplifies the electric current which has flowed to the light-receiving element 102 or 104, and converts the resulting electric current into a voltage. Consequently, by measuring the voltages at a terminal Vout2 and a terminal Vout4, it is possible to measure the leak current generated between the light-receiving elements.

Next, the switches 152 and 154 are turned on, and the switches 151 and 153 are turned off. At the same time, the predetermined voltage is applied to the terminal Vin.

Because the switches 152 and 154 are turned on, the electric current supplying unit 141 supplies, to each of the amplifiers 112 and 114, an electric current corresponding to the voltage applied to the terminal Vin. Each of the amplifiers 112 and 114 amplifies and converts, into a voltage, the electric current supplied from the electric current supplying unit 141, and then outputs the resultant to each of the terminals Vout2 and Vout4. Therefore, by measuring the voltage at each of the terminals Vout2 and Vout4 which corresponds to the voltage applied to the terminal Vin, it is possible to measure the characteristics of the amplifiers 112 and 114.

Meanwhile, because the switches 151 and 153 are turned off, no electric current is supplied to the light-receiving elements 101 and 103, and to the amplifiers 111 and 113. If there is a leak current between light-receiving elements, the electric current supplied from the electric current supplying unit 141 flows from the light-receiving element 102 or 104 to the light-receiving element 101 or 103. As a result, the amplifier 111 or 113 amplifies the electric current which has flowed to the light-receiving element 101 or 103, and converts the resulting electric current into a voltage. Consequently, by measuring the voltages at the terminal Vout1 and the terminal Vout3, it is possible to measure the leak current generated between the light-receiving elements.

Through the above described operations, it is possible to measure the characteristics of the amplifiers 111-114, and measure a leak current between the light-receiving elements 101-104. The conventional test circuit has separately conducted the measurement of the characteristics of the amplifiers 111-114, and the measurement of a leak current between the light-receiving elements 101-104. In contrast, the test circuit according to the present embodiment is capable of simultaneously measuring both the characteristics of the amplifiers 111-114 and a leak current between the light-receiving elements 101-104, using the same circuit. Consequently, the test circuit according to the present embodiment makes it possible to test the amplifiers 111-114 and detect a leak current between the light-receiving elements 101-104 efficiently in a short time.

In addition, by controlling the terminal Vin and the switches 151-154 from outside, the test circuit 300 according to the third embodiment is capable of measuring the characteristics of the amplifiers 111-114, and a leak current between the light-receiving elements 101-104. For example, the test circuit 300 according to the third embodiment is required to have only a test pad for applying a voltage to the terminal Vin, and two test pads for applying 2-bit control signals (a control signal for controlling the switches 151 and 153, and a control signal for controlling the switches 152 and 154) for selectively turning the switches 151-154 on/off. Note that the control signals for controlling the switches 151-154 may be 1-bit signals, and the switches 151 and 153 may be turned on and the switches 152 and 154 may be turned off, or vice versa, depending on whether the control signals indicate high or low. On the other hand, the conventional test circuit used for detecting a leak current requires to have a test pad for each of the light-receiving elements 101-104. That is to say, when the test circuit includes four light-receiving elements, four test pads are required. Consequently, the test circuit 300 according to the third embodiment, compared to the conventional test circuit, needs a smaller number of test pads, which leads to a smaller sized chip.

Furthermore, in the test circuit 300 according to the third embodiment, the switches 151-154 are turned off during an ordinary operation after the product shipment (apart from when a test is conducted). Therefore, during the ordinary operation, a parasitic load on the light-receiving elements and the amplifiers caused by the electric current supplying unit can be reduced.

Note that, in the above description, the electric current supplying unit 141 includes four electric current outputs, and four single-pole single-throw (SPST) switches as the switches, but the present invention is not limited to this. For example, the electric current supplying unit 141 may selectively supply an electric current to the light-receiving elements and the amplifiers via two electric current outputs (For example, the electric current supplying unit 141 does not include transistors Tr43 and Tr44, and resistances R45 and R46.) using two single-pole double-throw (SPDT) switches.

Fourth Embodiment

In the above described first embodiment, a leak current between light-receiving elements is measured by detecting a slide-in of an electric current supplied from the electric current supplying unit (that is, for example, an electric current supplied to the light-receiving element 101 slides into the light-receiving element 102 due to a leak current between the light-receiving elements 101 and 102). In a fourth embodiment, the following test circuit is described for detecting a leak current which is undetectable based on a slide-in of an electric current; the test circuit selectively controls reference voltages of amplifiers so as to generate a difference in voltages between light-receiving elements.

First, a structure of the test circuit according to the fourth embodiment of the present invention is described.

Figure 5:
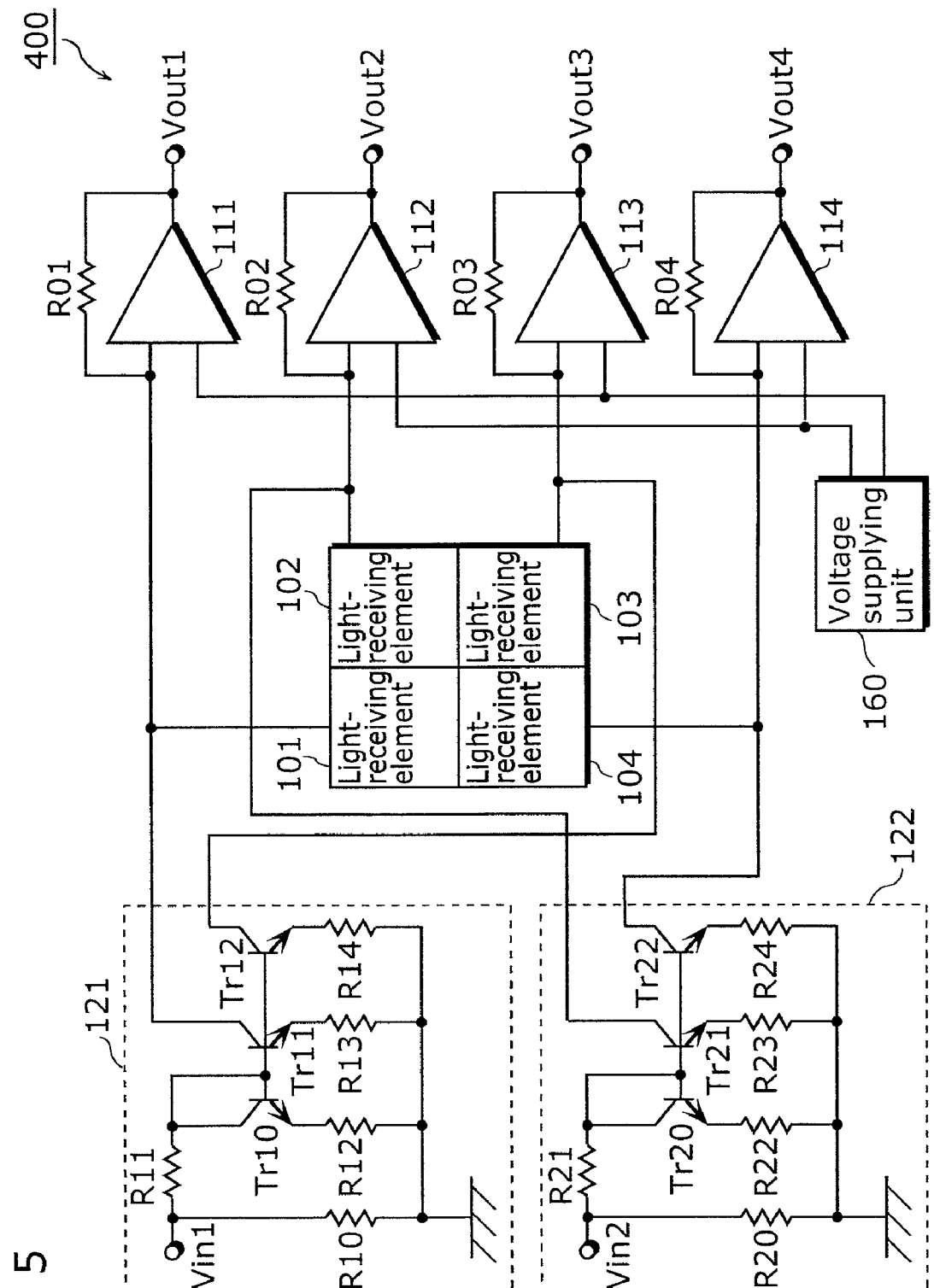
FIG. 5 is a diagram which shows a structure of a test circuit according to a fourth embodiment of the present invention.

FIG. 5 is a diagram which shows the structure of the test circuit according to the fourth embodiment of the present invention. Note that the same components as the ones in FIG. 2 are given the same reference numbers, and their detailed descriptions are omitted.

A test circuit 400 shown in FIG. 5 includes a voltage supplying unit 160 in addition to the components of the test circuit 100 shown in FIG. 2 according to the first embodiment.

The voltage supplying unit 160 supplies a reference voltage to each of amplifiers 111-114. When a test is conducted, the voltage supplying unit 160 supplies a reference voltage to the amplifiers 111 and 113, and a different reference voltage to the amplifiers 112 and 114. In other words, the voltage supplying unit 160 supplies different reference voltages to: the amplifiers which convert, into voltages, photoelectric currents supplied from light-receiving elements, out of a plurality of light-receiving elements, which are neither vertically nor horizontally adjacent to each other; and the amplifiers which convert, into voltages, photoelectric currents supplied from light-receiving elements which are vertically or horizontally adjacent to the above mentioned light-receiving elements.

Next, operations of the test circuit 400 according to the fourth embodiment are described.

First, as in the first embodiment, characteristics of the amplifiers 111 and 113, and a leak current between light-receiving elements are measured by measuring voltages at terminals Vout1-Vout4, in a state where the predetermined voltage is applied to a terminal Vin1 from outside the test circuit 400, and a terminal Vin2 is set to the ground level.

Also, characteristics of the amplifiers 112 and 114, and a leak current between light-receiving elements are measured by measuring voltages at the terminals Vout1-Vout4, in a state where the predetermined voltage is applied to the terminal Vin2 from outside the test circuit 400, and the terminal Vin1 is set to the ground level. Note that when the above test is being conducted, the voltage supplying unit 160 supplies, to each of the amplifiers 111-114, an equal reference voltage. The reference voltage that the voltage supplying unit 160 supplies is, for example, a voltage based on a reference voltage used for an ordinary operation (for example, a reference voltage in the worst condition to the characteristics of the amplifiers 111-114 in accordance with their specification).

Next, the voltage supplying unit 160 supplies a reference voltage to the amplifiers 111 and 113, and a different reference voltage to the amplifiers 112 and 114, in a state where the terminals Vin1 and Vin2 are connected to the ground. For example, the voltage supplying unit 160 supplies a voltage of 2V as a reference voltage to the amplifiers 111 and 113, and a voltage of 1V as a reference voltage to the amplifiers 112 and 114. In such a case, a virtual short causes the voltages at the other terminals of differential inputs of the amplifiers 111 and 113 to be 2V, and the voltage at the other terminals of differential inputs of the amplifiers 112 and 114 to be 1V. In other words, a voltage of 2V is supplied to the light-receiving elements 101 and 103, and a voltage of 1V is supplied to the light-receiving elements 102 and 104. As a result, a difference (1V) in voltages is generated between the light-receiving elements that are vertically or horizontally adjacent to each other, and when the difference in the voltages causes generation of a leak current between the light-receiving elements which are vertically or horizontally adjacent to each other, there will be a change in output voltages of the amplifiers which correspond to the light-receiving elements between which the leak current is generated. For example, in the case where a leak current is generated between the light-receiving elements 101 and 102, there is a change in the voltages at the terminals Vout1 and Vout2. Consequently, in a state where the voltage supplying unit 160 supplies different reference voltages to: the amplifiers 111 and 113; and the amplifiers 112 and 114, it is possible to measure a leak current between light-receiving elements by measuring voltages at the terminals Vout1-Vout4. In addition, by generating a difference in voltages between the light-receiving elements which are vertically or horizontally adjacent to each other, it is possible to detect a leak current, which differs from the leak current which is detected based on a slide-in of the electric current between the light-receiving elements which are vertically or horizontally adjacent to each other.

Through the above described operations, the test circuit 400 according to the fourth embodiment of the present invention is capable of detecting various leak currents between light-receiving elements, in addition to being capable of producing the advantages produced by the test circuit 100 according to the first embodiment.

Note that in the above description, the test of applying different reference voltages to the amplifiers is conducted after conducting the test of selectively supplying an electric current to light-receiving elements which are neither vertically nor horizontally adjacent to each other. However, in the case of not conducting the test of detecting a leak current between light-receiving elements based on a slide-in of the electric current, it is possible to test a plurality of amplifiers and detect a leak current which is detectable by a difference in voltages between light-receiving elements, by conducting a test of applying different reference voltages after conducting a test of supplying an electric current to all the amplifiers 111-114.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

The present invention is applicable to a test circuit, and particularly to a test circuit which is built in an optical pick-up PDIC used for an optical drive of a CD player, a DVD player, and the like.

What is claimed is:

1. A test circuit, comprising:
   a plurality of light-receiving elements;
   a plurality of amplifiers, each of which converts, into a voltage, a photoelectric current supplied from one of said plurality of light-receiving elements;
   a test pad to which a voltage is applied from outside; and
   an electric current supplier that supplies an electric current to each of said plurality of light-receiving elements and each of said plurality of amplifiers, the electric current corresponding to the voltage applied to said test pad,
   wherein said electric current supplier selectively supplies an electric current to a first group of light-receiving elements and to a second group of light-receiving elements, said first group of light-receiving elements including light-receiving elements, out of said plurality of light-receiving elements, which are neither vertically nor horizontally adjacent to each other, and said second group of light-receiving elements including light-receiving elements, out of said plurality of light-receiving elements, which are vertically or horizontally adjacent to said light-receiving elements of said first group of light-receiving elements, so that;
   each amplifier, out of said plurality of amplifiers, which converts a photoelectric current supplied from one light-receiving element included in one of said first group of light-receiving elements and said second group of light-receiving elements to which the electric current is supplied outputs a voltage to determine whether said amplifier is operating properly, and
   each amplifier, out of said plurality of amplifiers, that convert a photoelectric current supplied from one light-receiving element included in one of said first group of light-receiving elements and said second group of light-receiving elements to which the electric current is not supplied outputs a voltage to determine whether a leak current flows between said plurality of light-receiving elements.

2. The test circuit of claim 1,
   wherein said electric current supplier includes:
   a first electric current supplying subunit that supplies an electric current to said first group of light-receiving elements; and
   a second electric current supplying subunit that supplies an electric current to said second group of light-receiving elements,
   said first electric current supplying subunit does not supply an electric current while said second electric current supplying subunit supplies an electric current, and
   said second electric current supplying subunit does not supply an electric current while said first electric current supplying subunit supplies an electric current.

3. The test circuit of claim 1,
   wherein said electric current supplier supplies an electric current having a first electric current value to a first light-receiving element included in said first group of light-receiving elements, and supplies an electric current having a second electric current value to a second light-receiving element included in said first group of light-receiving elements.

4. The test circuit of claim 1,
   wherein said electric current supplier includes:
   an electric current supplying subunit operable to output an electric current; and
   a plurality of switches, each of which is provided between an output of said electric current supplying subunit, and a pair of one of said plurality of light-receiving elements and one of said plurality of amplifiers.

5. The test circuit of claim 1, further comprising
   a voltage supplier that supplies a first reference voltage to a first group of amplifiers, out of said plurality of amplifiers, which includes amplifiers each of which converts, into a voltage, the photoelectric current supplied from one of said light-receiving elements included in said first group of light-receiving elements; and to supply a second reference voltage to a second group of amplifiers, out of said plurality of amplifiers, which includes amplifiers, each of which converts, into a voltage, the photoelectric current supplied from one of said light-receiving elements included in said second group of light-receiving elements.

6. A test method for testing a plurality of amplifiers, each of which converts, into a voltage, a photoelectric current supplied from one of a plurality of light-receiving elements, said test method comprising:
   selectively supplying an electric current to a first group of light-receiving elements and to a second group of light-receiving elements, the first group of light-receiving elements including a plurality of light-receiving elements, out of the plurality of light-receiving elements, which are neither vertically nor horizontally adjacent to each other, and the second group of light-receiving elements including a plurality of light-receiving elements, out of the plurality of light-receiving elements, which are vertically or horizontally adjacent to the light-receiving elements included in the first group of light-receiving elements;

measuring the voltage converted by each of the amplifiers;

judging, based on the voltage converted by each of the amplifiers which converts, into a voltage, the photoelectric current supplied from one of the light-receiving elements included in the first group of light-receiving elements, whether or not each of the amplifiers is properly operating; and judging a leak current between the plurality of light-receiving elements, based on the voltage converted by each of the amplifiers which converts, into a voltage, the photoelectric current supplied from one of the light-receiving elements included in the second group of light-receiving elements.

\* \* \* \* \*